(12) United States Patent
Adrian

(10) Patent No.: US 11,868,188 B2
(45) Date of Patent: Jan. 9, 2024

(54) DEVICE CARRIER ASSEMBLY WITH A BIASED LATCH

(71) Applicant: Microsoft Technology Licensing, LLC, Redmond, WA (US)

(72) Inventor: Jason David Adrian, Woodinville, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 0 days.

(21) Appl. No.: 17/747,746

(22) Filed: May 18, 2022

(65) Prior Publication Data

US 2023/0376085 A1 Nov. 23, 2023

(51) Int. Cl.
*G06F 1/18* (2006.01)

(52) U.S. Cl.
CPC .................................. *G06F 1/187* (2013.01)

(58) Field of Classification Search
CPC ...... G11B 33/128; G11B 17/225; G06F 1/187
See application file for complete search history.

(56) References Cited

U.S. PATENT DOCUMENTS

| | | | | |
|---|---|---|---|---|
| 6,085,123 | A | * | 7/2000 | Baca .................... G11B 17/225 700/214 |
| 7,443,668 | B2 | * | 10/2008 | Hsu ......................... G11B 33/12 |
| 9,135,957 | B2 | | 9/2015 | Grobe et al. |
| 10,109,323 | B2 | | 10/2018 | Chhuor et al. |
| 10,765,028 | B1 | | 9/2020 | Beall et al. |
| 10,874,032 | B2 | | 12/2020 | Leigh et al. |
| 11,096,306 | B1 | | 8/2021 | Xu et al. |
| 2007/0053250 | A1 | | 3/2007 | Wu |
| 2009/0292852 | A1 | | 11/2009 | Justice et al. |
| 2011/0182026 | A1 | * | 7/2011 | Kang ................... G11B 33/124 361/679.02 |
| 2015/0146372 | A1 | | 5/2015 | French et al. |
| 2019/0079565 | A1 | | 3/2019 | Adrian |
| 2020/0089293 | A1 | | 3/2020 | Enright et al. |

OTHER PUBLICATIONS

"Hard Disk Drives", Retrieved from: http://www.bigbearautomation.com/experience5.htm, Jan. 31, 2001, 2 Pages.
"Supermicro—User's Manual—SC946S JBOD Chassis", Retrieved from: https://www.supermicro.com/manuals/chassis/4U/SC946_JBOD.pdf, Mar. 13, 2017, 86 Pages.
"International Search Report and Written Opinion issued in PCT Application No. PCT/US23/013393", dated Jun. 14, 2023, 12 Pages.

* cited by examiner

*Primary Examiner* — James Wu
(74) *Attorney, Agent, or Firm* — Holzer Patel Drennan

(57) ABSTRACT

The described technology provides implementations of a storage device carrier assembly adapted to removably mate with a chassis. The storage device carrier assembly includes a storage device carrier adapted to be coupled to a storage device and a biased latch attached to the storage device carrier and adapted to transition from an engaged state to a retracted state to remove the storage device carrier from the chassis, wherein the biased latch includes extendable portions adapted to engage the chassis in the engaged state.

20 Claims, 7 Drawing Sheets

DEVICE CARRIER ASSEMBLY WITH A BIASED LATCH

BACKGROUND

Computing device chassis such as server rack assemblies include many storage devices and other insertable computing elements. The insertable computing elements, especially hard disk drives with mechanical arms, wear out over time. The insertable computing elements that fail may require manual replacement. Insertable computing elements can be manually replaced when the storage devices fail or are otherwise designated for replacement.

SUMMARY

The described technology provides implementations of a storage device carrier assembly adapted to removably mate with a chassis. The storage device carrier assembly includes a storage device carrier adapted to be coupled to a storage device and a biased latch attached to the storage device carrier and adapted to transition from an engaged state to a retracted state to remove the storage device carrier from the chassis, wherein the biased latch includes extendable portions adapted to engage the chassis in the engaged state.

This summary is provided to introduce a selection of concepts in a simplified form that is further described below in the Detailed Description. This summary is not intended to identify key features or essential features of the claimed subject matter, nor is it intended to be used to limit the scope of the claimed subject matter.

Other implementations are also described and recited herein.

BRIEF DESCRIPTIONS OF THE DRAWINGS

DETAILED DESCRIPTIONS

Figure 1:
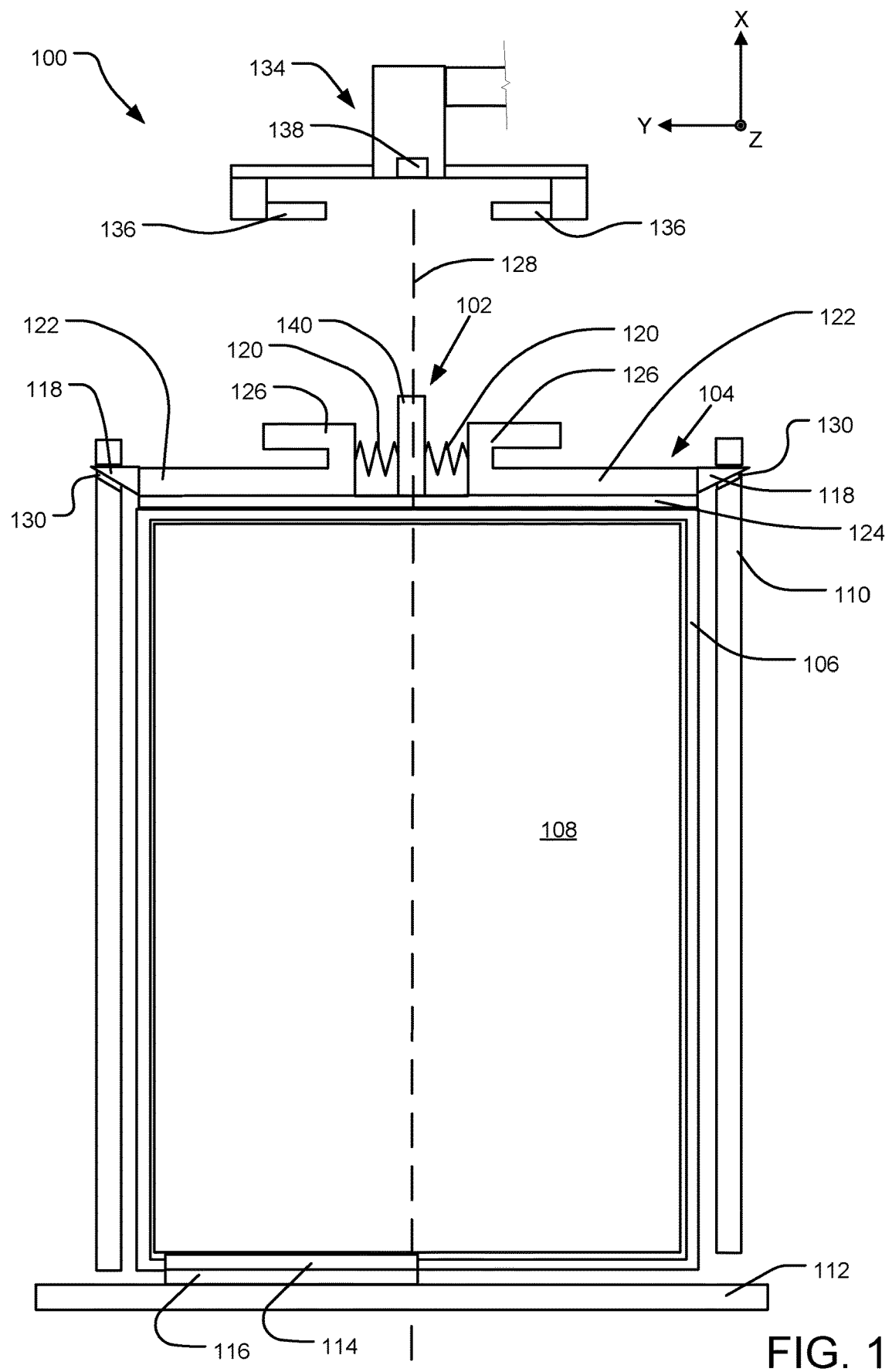
FIG. 1 illustrates an example computing device system.

Replacing insertable computing elements such as storage devices in storage arrays can be complicated, as manual removal often requires a number of manual manipulations to remove the storage devices. For example, the server racks may include chassis or other recesses, each fitted with permanently attached latches that can be difficult to manipulate. Also, the manipulation required may not lend itself to automation because the typical engagement tools automation or robotic systems actuate are not adapted to existing latch structures. Further still, the process of removing the storage devices from storage arrays may include steps for identifying the removed devices (e.g., for cataloging, inventory, and/or tracking disposal) and/or the replacement storage devices that are selected to replace the removed storage devices. Automating these identification processes may be difficult with existing storage array assemblies. Also, determining an identity of a storage device and/or whether a storage device is fully engaged in a correct position within a chassis of a storage array may not be intuitive for an automated system.

The presently disclosed technology provides a device carrier assembly that is adapted for the automated replacement of computing device elements in a computing system. For example, a device carrier assembly can be removably mated with a chassis (e.g., of a server rack or other computer device form factor). Providing a device carrier assembly that is adapted to interact with robotic actuator assemblies can facilitate the efficient maintenance of computer devices on a large scale. Whether the robotic actuator assembly is replacing storage carrier device assemblies of servers with manifold storage carrier device assemblies replacing storage devices in smaller computer systems on a large scale, an automated system for replacing hardware components can improve both time and cost-efficiency.

In an implementation, a device carrier assembly includes a device carrier attached to a biased latch. The device carrier assembly may be adapted to removably mate with a chassis of a computer device. The biased latch may be positioned on a portion of the device carrier assembly that remains exposed and/or accessible when the device carrier assembly is mated with the chassis to allow for efficient insertion and removal of the device carrier assembly. As described herein, the biased latch is biased in that extendable portions of the latch are biased or tend towards the extension of extendable portions of the biased latch when no external force is applied to the biased latch. The biased latch may be transitioned between different states, each reflecting an extent to which extendable portions of the biased latch laterally extend, the states including one or more of an engaged state, a retracted state, and an extended state. In an implementation, an automated system may include an automated and/or robotic device with an actuator assembly. The actuator assembly may be used to manipulate the biased latch by applying an engagement force to engagement elements of the biased latch and to transition the biased latch between different states.

FIG. 1 illustrates an example computing device system 100. The computing device system 100 includes a device carrier assembly 102 and a chassis 110 of a computing device. The device carrier assembly 102 is couplable to a computing element such as a storage device 108. The device carrier assembly 102 is adapted to removably mate with the chassis 110. When the device carrier assembly 102 mates with the chassis 110, communication interface 114 is communicatively coupled with a computing device communication interface 116 coupled to a computing board 112 (e.g., a printed computer board) or to another computing element of the computing device of which the chassis is an element.

In an implementation, the device carrier assembly 102 includes a device carrier 106. The device carrier 106 is couplable to an insertable computing element such as a storage device 108. The storage device 108 is illustrated for purposes of demonstration of an implementation in which the device carrier 106 is a storage device carrier adapted to couple with a storage device 108, but the device carrier assembly 102 may be a computing element device carrier assembly for use with any insertable computing element insertable into a computing device's chassis 110. In an implementation, the device carrier 106 is separably couplable to (e.g., adapted to be transitioned between being coupled to and decoupled from) the storage device 108. The device carrier 106 may confer toolless separable couplability, such as by pressure fit and/or by fixtures in the device carrier 106 that include pegs or protrusions adapted to engage apertures at predefined locations of the storage device 108 or the other insertable computing element. In one implementation, the device carrier 106 includes at least one aperture to facilitate the communicative coupling between the communication interface 114 and the computing device communication interface 116.

The device carrier assembly 102 may further include a biased latch 104. In an implementation, the device carrier 106 is attached or otherwise coupled to a biased latch 104. As described herein, the biased latch 104 is biased in that extendable portions 118 of the latch are biased or tend towards the lateral extension of extendable portions 118 when no engagement force is applied to the biased latch 104. A biasing element 120, such as a spring, is used to provide a biasing force. For example, a biasing element 120 is either adapted to be biased towards expansion relative to its compressed state or toward contraction relative to its extended state. Other biasing elements 120 are contemplated, including elements composed of elastomeric materials (which can store potential energy when an engagement force is applied), bands, foams, hydraulics, and the like. In the illustrated implementation, the biased latch 104 is in the engaged state. In the implementation illustrated in FIG. 1, the computing device system 100 includes two biasing elements 120, each coupled on a first end to a central support 140 and coupled on a second end to one of the engagement elements 126.

The biased latch 104 can be toggled between two or more positions to facilitate the removable mating of the device carrier assembly 102 with the chassis 110. For example, the biased latch 104 may be manipulated to transition the biased latch 104 between states, including one or more of an extended state, a retracted state, and an engaged state. In an extended state, the biasing element 120 is relaxed (e.g., no force is applied to it), and extendable portions 118 of the biased latch 104 are allowed to fully extend laterally to a predefined extended state distance relative to a central device carrier assembly axis 128. In a retracted state, an engagement force is applied to the biased latch 104 (e.g., to a biasing element 120) to retract the extendable portions 118 medially to a predefined retracted state distance relative to the central device carrier assembly axis 128. In an engaged state, the extendable portions 118 extend to a predefined engaged state distance relative to the central device carrier assembly axis 128 to engage elements of the chassis 110.

In an implementation, the engaged state and the extended state are different. For example, the extendable portions 118 in the engaged state may engage portions of the chassis 110 at an engaged state distance that is less than the extended state distance, maintaining a lateral bias force at the engagement between the chassis 110 and the extendable portions 118. In another implementation, the engaged state distance and the extended state distance are substantially the same, such that when the extendable portions 118 are engaged with the chassis 110, a biased lateral force is substantially not applied by the extendable portions to the chassis (substantially in the sense that manufacturing tolerances may provide too little distance in the chassis 110 for the extendable portions 118 to fully extend within the chassis). The extendable portions 118 may have radially terminal complementary portions that are shaped to complement complementary portions of the chassis 110. For example, the chassis may include apertures and/or recesses that may be complementarily shaped to conformingly receive the radially terminal complementary portions of the extendable portions 118. As illustrated, the radially terminal complementary portions are triangular in the illustrated cross-section, and the chassis 110 includes chassis engagement portions 130, such as complementarily-shaped recesses, at predetermined positions. In the illustrated implementation, the extendable portions 118 extend through the chassis 110 in the engaged state, but implementations are contemplated in which the extendable portions 118 remain within the chassis 110 when engaged.

The engaged state is a state in which the device carrier assembly 102 is within the chassis 110 and has reached a predefined position in the chassis 110 at which the extendable portions 118 are adapted to engage portions of the chassis 110. For example, the extendable portions 118 may be adapted to engage recesses in the chassis 110. When the extendable portions 118 are engaged with the chassis 110 in the engaged state, the extendable portions 118 may hold the device carrier assembly 102 at a predefined position in the chassis 110. The predefined position within the chassis 110, which the device carrier assembly 102 reaches, may be configured to position communication interfaces 114 and 116 to mate within the chassis 110, providing data communication between the computing device of which the chassis 110 is an element and the storage device 108.

In an implementation, the biased latch 104 includes a mechanical indicator (not illustrated in FIG. 1) to indicate a state of the biased latch 104. For example, the mechanical indicator may provide different visual or other indicators indicating each of one or more of the engaged state, the retracted state, and the extended state. In an implementation, the mechanical indicator is mechanically manipulable to provide the indicators. For example, the mechanical indicator may include a first element 122 (e.g., an externally visible element) and a second element 124 at least one of which is moved relative to the other to modify a displayed indicator when the biased latch 104 is transitioned between a retracted state and the engaged or extended state.

In an implementation, the first element 122 at least partially covers the second element 124, and a transparent portion of the first element 122 exposes a portion of the second element 124 that includes the indicators. The transparent portion may be an aperture and/or may be a portion including transparent materials. The transparent portion may be transparent to specific portions of the electromagnetic spectrum, which may include or exclude the visible spectrum or any other part of the electromagnetic spectrum. In one implementation, the indicators include one or more of different colors, different patterns, different computer-readable patterns (e.g., bar or QR codes), different reflectivities, different refraction properties, different diffraction properties, different levels of embossing, and the like.

The illustrated implementation of the computing device system 100 includes an automated (e.g., robotic) device (not illustrated in its entirety) that includes an actuator assembly 134 that functions to selectably insert and/or remove the device carrier assembly 102, along with the storage device 108, from the chassis 110. In this implementation, the computing device system 100 is an automated hardware manipulation system. The actuator assembly 134 may be manipulable to manipulate the biased latch 104 by applying an engagement force to engagement elements 126 of the biased latch 104.

In different implementations, the actuator assembly 134 may have different forms and features. By way of example, the actuator assembly 134 is shown to include actuator engagement portions 136 that complement and/or are operable to engage the engagement elements 126 (e.g., at complementary portions of the engagement elements 126) to transition the biased latch 104 between one or more of the engaged state, the retracted state, and the extended state. The actuator engagement portions 136 are operable to apply engagement forces to the engagement elements 126 to oppose the bias force of the biased latch 104 and/or to move the device carrier assembly 102 to be inserted into or removed from the chassis 110. This configuration may allow the actuator assembly 134 to insert the device carrier assembly 102 into or remove the device carrier assembly 102 from the chassis 110.

In one implementation, the actuator assembly 134 is operated in cooperation with a sensor 138 to detect indicators of a mechanical indicator and to determine by an automated actuator protocol when sufficient force has been applied to transition the biased latch 104 between the states (e.g., in a feedback loop). For example, the same or a different sensor 138 can be used to determine for how long and/or how far to either insert the device carrier assembly 102 to a predefined position in a chassis 110 and/or remove the device carrier assembly 102 from the chassis 110 (e.g., in a different feedback loop). Implementations are also contemplated in which one or more of a predefined engagement force, an insertion routing, a removal routine, a predefined insertion distance, and a predefined removal distance are preprogrammed in automated actuator protocols, such that the actuator assembly 134 may not use the sensor 138 (e.g., which may then be omitted) or may use the sensor 138 for confirmation.

In still other implementations, the biased latch 104 and/or the device carrier assembly 102 are manually operated, and the automated device is omitted from the computing device system 100.

The device carrier assembly 102 is adapted to be removably mated with the chassis 110. To begin insertion of the device carrier assembly 102 into the chassis 110, an engagement force is applied to the biased latch 104, transitioning the biased latch 104 from an extended state to a retracted state. The engagement force causes the extendable portions 118 to retract to a distance that allows the device carrier assembly 102 to be inserted into the chassis 110.

The device carrier assembly 102 is inserted (e.g., lowered) into the chassis 110 while the biased latch 104 is in the retracted state until at least a portion of the device carrier assembly 102 is inserted to reach a predefined position in the chassis 110 (e.g., at which the communication interfaces 114 and 116 communicatively couple or otherwise communicatively interface). The engagement force is then removed, allowing the biased latch 104 to transition by its bias to the engaged state at which the extendable portions 118 engage portions of the chassis 110 (e.g., recesses and/or apertures in the chassis 110). When the biased latch 104 is in the engaged state, the device carrier assembly 102 may be locked into the chassis 110.

In an implementation, the device carrier assembly 102 is removed (e.g., disengaged and/or raised) from the chassis by applying an engagement force to the engagement elements 126 to cause the biased latch 104 to transition from an engaged state to a retracted state. Then, the device carrier assembly 102 is removed from the chassis 110. The engagement force may be removed after the extendable portions 118 clear predefined engagement portions within the chassis even while the extendable portions 118 remain within the chassis 110, or the engagement force may be removed after the extendable portions 118 leave the chassis 110. The ceasing of the engagement force may allow the biased latch 104 to transition from the retracted state to the extended state (e.g., after the extendable portions 118 leave the chassis 110).

The central device carrier assembly axis 128 is illustrated for reference. As used herein, a medial direction is toward the central device carrier assembly axis 128, and a lateral direction is away from the central device carrier assembly axis 128. An insertion direction is a direction substantially along the central device carrier assembly axis 128 towards an interior of the chassis in which the device carrier assembly 102 is inserted into the chassis 110, and a removal direction is an opposing direction substantially along the central device carrier assembly axis 128 away from the interior of the chassis 110 in which the device carrier assembly 102 is removed from the chassis 110.

Figure 2:
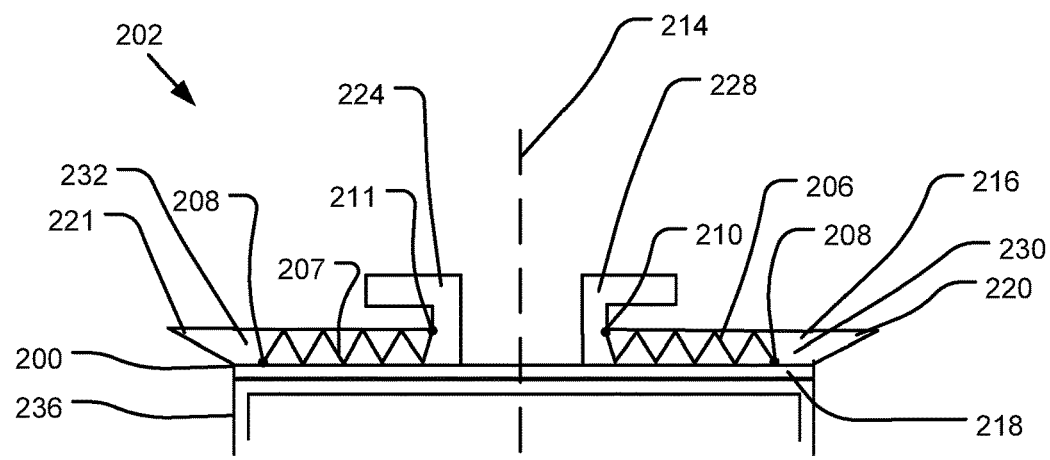
FIG. 2 illustrates example implementations of a biased latch that includes one or more tension biasing elements.
Figure 2:
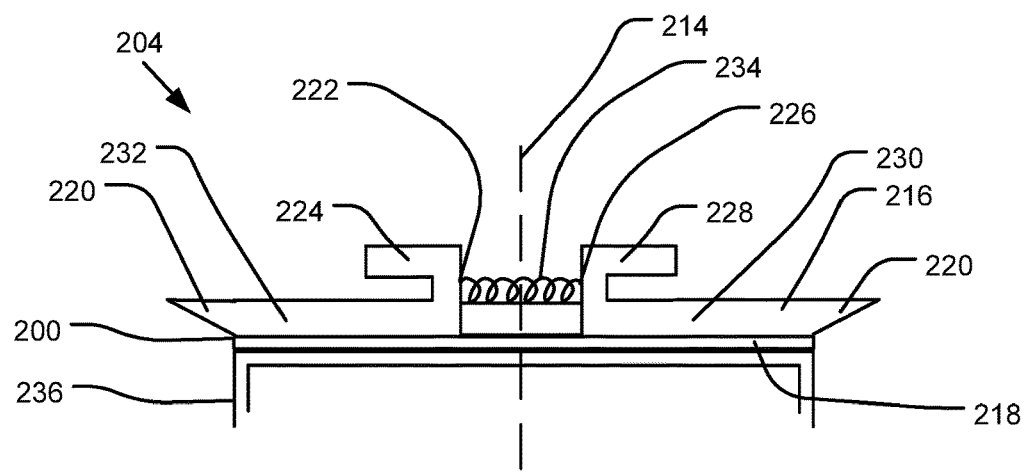

FIG. 2 illustrates example implementations 202, 204 of a biased latch 200 that include one or more tension biasing elements. In the illustrated implementation, a gripping mechanism 216 of the biased latch 200 includes two separate elements 230, 232 as illustrated. The two separate elements 230 and 232 each further include an engagement element 228 and 224, respectively, as well as an extendible portion 220 or 221, respectively. When an engagement force is applied medially towards a central axis 214 to the engagement elements 224, 228, the two separate elements 230, 232 move medially to retract extendable portions 220, 221 medially. A portion of the biased latch 200 is coupled to a device carrier 236.

In a first implementation 202, there are two tension biasing elements 206, 207, and each of the tension biasing elements 206, 207 is coupled to a proximal coupling position 210 radially proximal to the central axis 214 relative to a distal coupling position 208. In an implementation, the two separate elements 230 and 232 of the gripping mechanism 216 slide or otherwise move relative to a base element 218 that remains stationary. For example, the biased latch 200 may operate like a slide rail such that one of the gripping mechanism 216 and the base element 218 includes a portion that functions as a rail that receives a portion of the other that functions as a guide. Other relative sliding arrangements are contemplated such as a barrel bolt sliding arrangement in which one of the gripping mechanism 216 and the base element 218 includes a portion that functions as a bolt and the other includes a portion that functions as a barrel that receives the portion that functions as a bolt.

In the first implementation 202, the tension biasing elements 206, 207 are tension springs, configured to resist elongation. In an implementation, a proximal coupling position 210 of a tension biasing element 206 and/or 207 (e.g., a tension spring) is on one or more of the gripping mechanism 216 and the base element 218, and a distal coupling position 208 of the tension biasing element 206 and/or 207 is on the other of the gripping mechanism 216 and the base element 218. For example, the gripping mechanism 216 and the base element 218 are configured to move relative to each other in response to an applied engaging force that is opposite of and stronger than a tension biasing force of the tension biasing elements 206, 207. Applying an engagement force to the engagement elements 224, 228, stretches the tension biasing elements 206, 207, and removing the engagement force causes the tension biasing elements 206, 207 to contract. In the illustrated implementation, two tension springs are arranged with radial symmetry about the axis (and/or mirror symmetry about a plane emerging from the illustration with the central axis 214 as a projection).

In a second implementation 204, the biased latch 200 includes a compression biasing element 234 (e.g., a compression spring). In the illustrated implementation, the compression biasing element 234 is coupled at a first end to a first position 222 of the first separate element 232 of the gripping mechanism 216 and at a second end to a second position 226 of the second separate element. In the illustrated implementation, the compression biasing element 234 (e.g., a compression spring) is configured to resist compression. Applying an engagement force to the engagement elements 224, 228 compresses the compression biasing element 234, and removing the engagement force causes the compression biasing element 234 to expand. In the illustrated implementation, a single compression spring is arranged to have radial symmetry about the central axis 214 (and/or mirror symmetry about a plane emerging from the illustration with the central axis 214 as a projection in the illustrated perspective).

Figure 3:
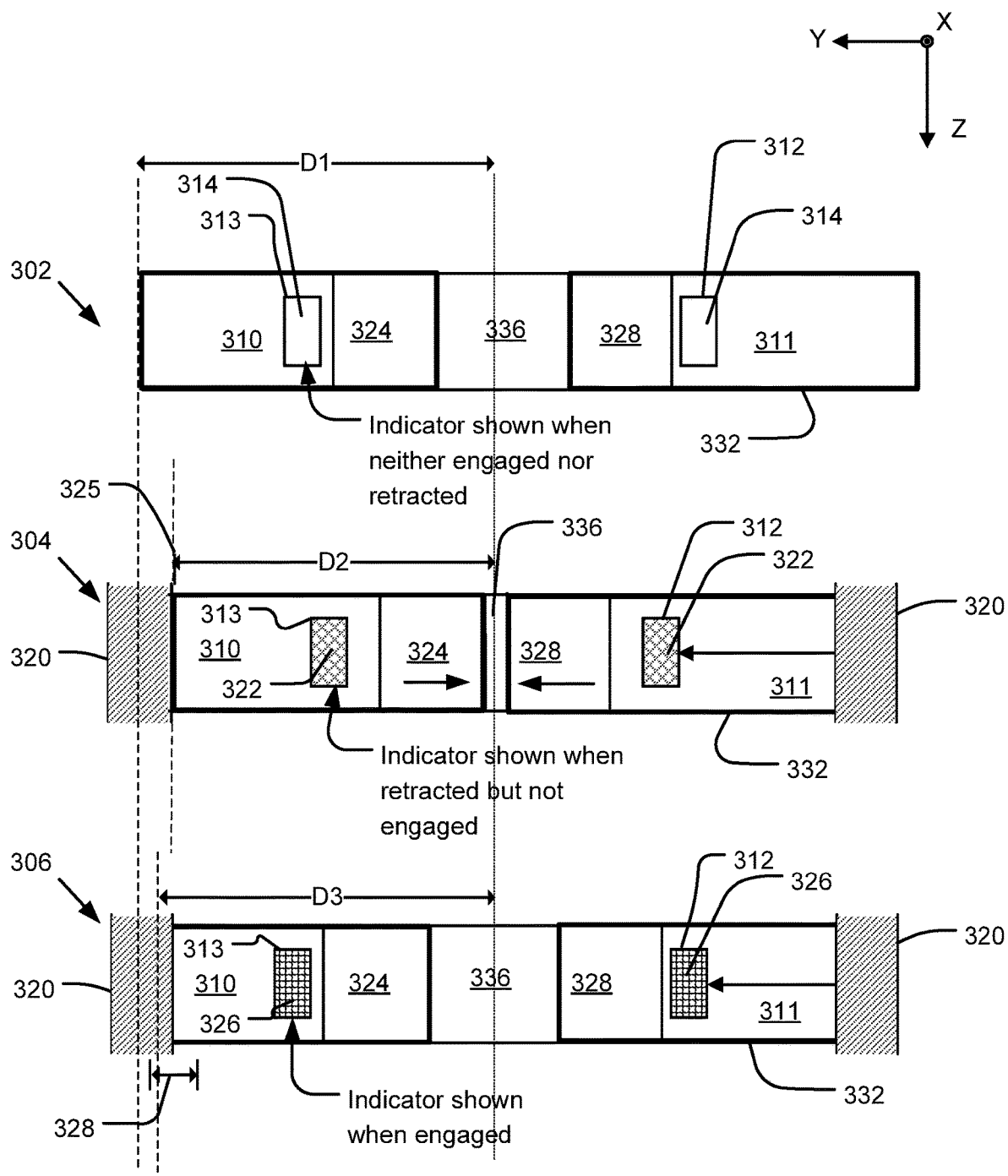
FIG. 3 illustrates example different states of a mechanical indicator that is included within of a biased latch of a device carrier assembly.

FIG. 3 illustrates example different mechanical indicator states 302, 304, and 306 of a mechanical indicator that is included within of a biased latch 332 of a device carrier assembly, such as the device carrier assemblies described above with respect to either of FIG. 1-2. In one implementation, the biased latch 332 is a top-down view of one of the configurations of the biased latches shown in FIG. 2. For example engagement elements 324, 328 in FIG. 3 correspond to the engagement elements 224, 228 in FIG. 2 and extendable portions 310, 311 in FIG. 3 correspond to the extendible portions 220, 221 in FIG. 2.

The engagement element 328 is attached to, and configured to move together with, the extendible portion 311 relative to an underlying base element 336 (e.g., corresponding to base element 218 in FIG. 2). Likewise, the engagement element 324 is attached to, and configured to move together with, the extendible portion 310. The extendible portions 310, 311 each have a transparent portion 312 (e.g., a window) through which a portion of the base element 336 is visible. The base element 336 includes different indicators 314, 322, and 326 that are visible through the transparent portion 312 at each of multiple different respective positions of the engagement elements 324, 328 relative to the underlying base element 336. By example, FIG. 3 illustrates two identical transparent windows 312, 313 (one in each of the extendible portions 310, 311). The indicator state shown through these two windows is identical in each of the mechanical indicator states described below. Therefore, the mechanical indicator states are described with respect to a single one of these windows (312).

In a first mechanical indicator state 302, the biased latch 332 is in an extended state at which no engagement force is applied to engagement elements 324, 328. In the extended state, the extendable portions 310, 311 extend laterally to a predefined extended state distance D1 (e.g., relative to a laterally distal edge of the underlying base element 336 of the biased latch 332). In various implementations, the transparent portion 312 may include an empty aperture and/or a transparent or translucent material through which electromagnetic radiation reflected from the underlying base element 336 can be sensed or otherwise detected. In one implementation, the transparent portion 312 is transparent to specific portions of the electromagnetic spectrum which may include or exclude the visible spectrum or any other part of the electromagnetic spectrum. In the first mechanical indicator state 302, a first indicator 314 on the underlying base element 336 is exposed through the transparent portion 312. The first indicator 314 indicates that the biased latch 332 is in an extended state.

In a second mechanical indicator state 304, the biased latch 332 is in a retracted state. An engagement force has been applied to the engagement elements 334, 328, and the biased latch 332 has, in the retracted state, been lowered into a chassis 320. In the retracted state, the extendable portions 310, 311 extend laterally to a predefined retracted state distance D2 relative to a laterally distal edge of the underlying base element 336 of the biased latch 332 (e.g., where D2 is less than D1). In the second mechanical indicator state 304, the transparent portion 312 exposes a second indicator 322 on the underlying base element 336, indicating that the biased latch 332 is in the retracted state.

In a third mechanical indicator state 306, the biased latch 332 is in an engaged state at which no force is applied to the engagement elements 324, 328, and the extendable portions 310, 311 extend to engage with the chassis 320. In the engaged state, the extendable portions 310, 311 extend laterally to a predefined engaged state distance D3 relative to a laterally distal edge of the underlying base element 336 of the biased latch 332 (e.g., where D3 is greater than D2 but less than D1). In the third mechanical indicator state 306, the transparent portion 312 exposes a third indicator 326 on the underlying base element 336, indicating that the biased latch 332 is in the engaged state. In implementations, the first mechanical indicator state 302 and the third mechanical indicator state 306 are the same (e.g., because the extended and engaged states of the biased latch 332 are substantially the same), and the biased latch 332 does not include the first indicator 314. In this implementation, in the first mechanical indicator state 302, the transparent portion exposes the third indicator 326.

In an implementation, one or more of the indicators 314, 322, and 326 include one or more of different colors, different patterns, different computer-readable patterns (e.g., bar or QR codes), different reflectivities, different refraction properties, different diffraction properties, different levels of embossing and/or etching, and the like. In an implementation, a sensor of an automated system may be operable to detect and/or interpret one or more of the indicators 314, 322, and 326. In an implementation, the sensor detects one or more of the indicators 314, 322, and 326 and uses the detected indicators 314, 322, and 326 in a feedback loop to determine how much engagement force to apply to transition the biased latch 332 between the retracted state and one of the extended state and the engaged state. The sensor may be configured to detect the extent to which the transparent portion 312 is aligned with one of the indicators 314, 322, and 326 in order to ensure the feedback loop results in an actuator assembly of the automated system applying sufficient engagement force to fully transition the biased latch 332 between states. For example, the detection may need to satisfy an alignment condition for the sensor to determine that the biased latch is in a particular state. The alignment condition may include one or more of a minimum area of exposure of an indicator 314, 322, or 326; a minimum level of pattern recognition in the indicator 314, 322, or 326; a minimum alignment between the indicator 314, 322, or 326 and the transparent portion 312; and the like. In an implementation, the sensor may be operable to determine information by detecting the informational indicator 330. In implementations, the sensor may also use one or more of the indicators 314, 322, and 326 as references to determine a placement distance representing a distance the device carrier assembly moves within the chassis 320 in order to insert the device carrier assembly into or remove the device carrier assembly from the chassis 320.

Figure 4:
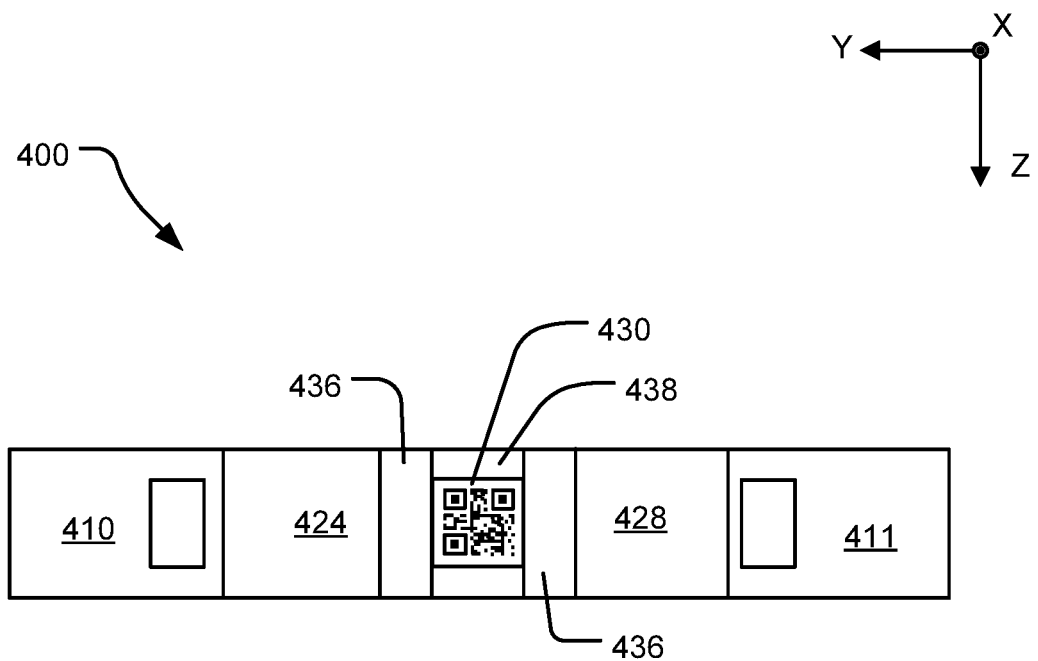
FIG. 4 illustrates an example biased latch with an information indicator.

FIG. 4 illustrates an example biased latch 400 with an information indicator 430. The biased latch 400 may include some or all of the features described with regard to FIG. 3 and additionally includes an information indicator 430. In different implementations, the information indicator 430 may include different types of information, such as identifying information for a storage device in the device carrier assembly (e.g., a storage device serial number), identifying information for the device carrier of the device carrier assembly, identifying information for the device carrier assembly, manufacture dates (e.g., of the storage device or other insertable computing element), installation dates, anticipated expiration dates, model information for the drive, a link (or pointer) to any of the preceding information stored in a database (e.g., a live link/database that is kept current with respect to the information), and the like.

The information indicator 430 is shown to be positioned in a central region of the biased latch 400 and may be located in different positions in different implementations, including on one or more of an extendable portion 410 and/or 411, an underlying base element 436, engagement elements 424, 428, and a central support 438 (as illustrated) between the engagement elements 424, 428. In an implementation, the information indicator 430 is positioned on the underlying base element 436 and is made visible by moving of one or more extendable portions 410, 411 to transition the biased latch 400 to one of the extended state, the retracted state, and the engaged state. In an implementation, the information indicator 430 includes one or more of different colors, different patterns, different computer-readable patterns (e.g., bar or QR codes), different reflectivities, different refraction properties, different diffraction properties, different levels of embossing and/or etching, and the like. In an implementation, a sensor of an automated system may be operable to detect and/or interpret the information indicator 430.

Figure 5:
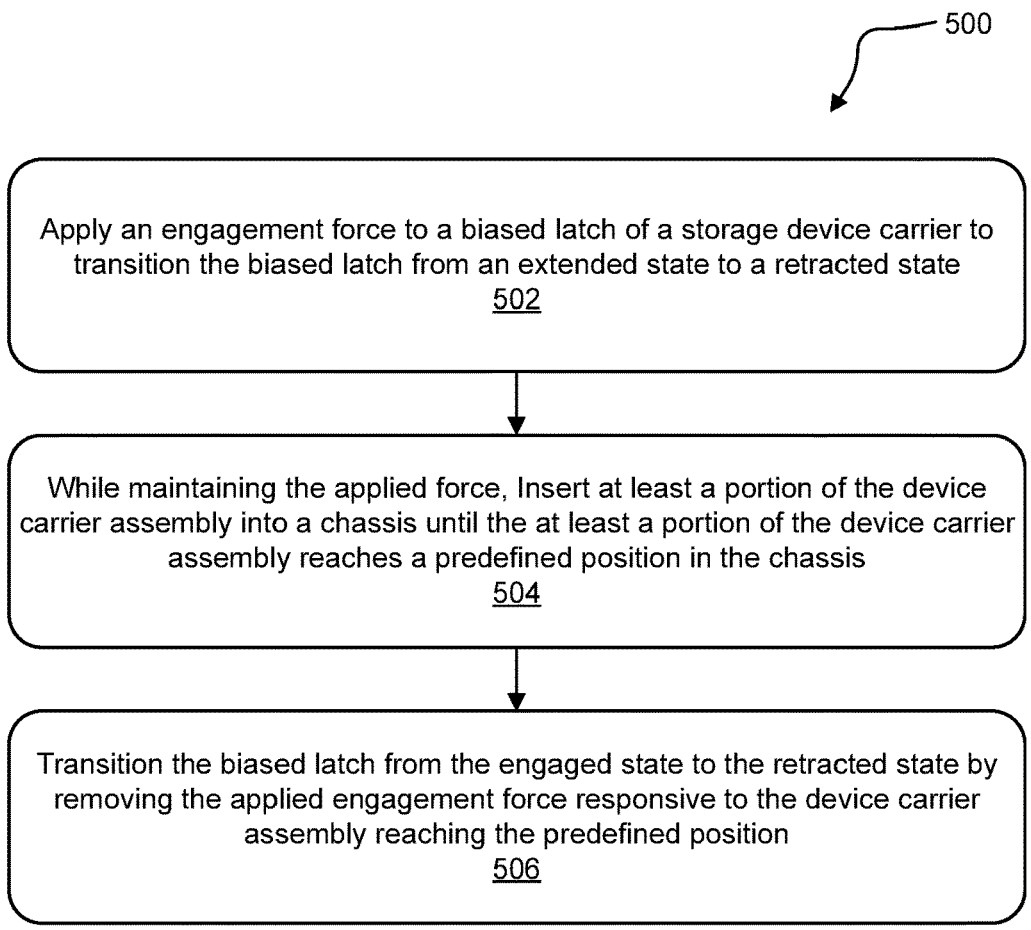
FIG. 5 illustrates example operations for inserting a device carrier assembly into a chassis of a computing device.

FIG. 5 illustrates example operations 500 for inserting a device carrier assembly into a chassis of a computing device. An applying operation 502 applies an engagement force to a biased latch of a device carrier to transition the biased latch from an extended state to a retracted state. In an implementation, extendable portions of the biased latch extend further in the extended state than in the retracted state.

In an implementation, the device carrier assembly includes a device carrier. The device carrier is couplable to an insertable computing element such as a storage device. The device carrier assembly couple to a computing element device carrier assembly for use with any insertable computing element. In an implementation, the device carrier is separably couplable to (e.g., adapted to be transitioned between being coupled to and decoupled from) the insertable computing element, such as a storage device. The device carrier may confer toolless separable couplability, such as by pressure fit and/or by fixtures in the device carrier 106 that include pegs or protrusions adapted to engage apertures at predefined locations of the storage device 108 or the other insertable computing element. The device carrier may include at least one aperture to facilitate the communicative coupling between the computing element communication interface and the computing device communication interface.

The device carrier assembly may further include a biased latch. In an implementation, the device carrier is attached or otherwise coupled to a biased latch. A biasing element, such as a spring, is used to provide the biasing force of the biased latch. For example, a compression biasing element is adapted to be biased by a biasing force towards expansion when it is compressed, and a tension biasing element is adapted to be biased by a different biasing force towards contraction when its extended state. Other biasing elements are contemplated, including elements composed of elastomeric materials (which can store potential energy when an engagement force is applied), bands, foams, hydraulics, and the like.

The biased latch may be manipulated to facilitate the removable mating of the device carrier assembly with the chassis. For example, the biased latch may be manipulated to transition the biased latch between states, including one or more of an extended state, a retracted state, and an engaged state. In the extended state, the biasing element is relaxed (e.g., no force is applied to it), and extendable portions of the biased latch are allowed to fully extend laterally to a predefined extended state distance. In the retracted state, an engagement force is applied to the biased latch to retract the extendable elements medially to a predefined retracted state distance. In an engaged state, the extendable portions extend to a predefined engaged state distance to engage elements of the chassis.

In an implementation, the biased latch includes a mechanical indicator to indicate a state of the biased latch. For example, the mechanical indicator may provide different indicators for each of one or more of the engaged state, the retracted state, and the extended state. In an implementation, the mechanical indicator is mechanically manipulable to provide the displayed indicators. For example, the biased latch may include a first element and a second element, at least one of which is moved relative to the other to modify the displayed indicator. The movement may be consistent with or caused by applying an engagement force to the biased latch. In an implementation, the first element at least partially covers the second element, and a transparent portion of the first element exposes a portion of the second element that includes the indicators. The transparent portion may be an aperture and/or may be a portion including transparent materials. The transparent portion may be transparent to specific portions of the electromagnetic spectrum which may include or exclude the visible spectrum or any other part of the electromagnetic spectrum. In one implementation, the indicators include one or more of different colors, different patterns, different computer-readable patterns (e.g., bar or QR codes), different reflectivities, different refraction properties, different diffraction properties, different levels of embossing, and the like.

In an implementation, the device carrier assembly is adapted to be removably mated with the chassis by the applying operation 502 applying the engagement force to the biased latch, which may transition the biased latch from an extended state to a retracted state. The engagement force may cause the extendable portions to retract to a distance that allows the device carrier assembly to be inserted into the chassis.

An inserting operation 504 inserts a portion of the device carrier into a chassis until the portion reaches a predefined position in the chassis. The inserting operation 504 inserts the device carrier assembly (e.g., by engaging one or more of the engagement elements and the first element) while the biased latch is in the retracted state until at least a portion of the storage carrier device assembly is inserted to reach a predefined point in the chassis (e.g., at which the communication interfaces of the insertable computing element an element of the computing system of which the chassis is an element mate). When the device carrier assembly mates with the chassis, a computing element communication interface is communicatively coupled with a computing device communication interface coupled to a computing board (e.g., a printed computer board) or other computing device element of the computing device of which the chassis is an element.

A removing operation 506 removes the applied force. For example, the applied force may be removed responsive to the device carrier assembly reaching the predefined position. The removal of the applied force causes the biased latch to transition from the retracted state to an engaged state. In an implementation, the extendable portions of the biased latch in the engaged state engage a portion of the chassis and extend further than in the retracted state.

The engaged state is a state in which the device carrier assembly is within the chassis and has reached a predefined position in the chassis at which the extendable elements are adapted to engage predefined portions of the chassis. For example, the extendable elements may be adapted to engage recesses or apertures in the chassis. When the extendable elements are engaged with the chassis in the engaged state, the extendable elements may hold the device carrier assembly at a predefined position in the chassis. The predefined position within the chassis which the device carrier assembly reaches may be configured to position communication interfaces to mate within the chassis, providing data communication between the computing device of which the chassis is an element and the storage device.

In an implementation, the engaged state and the extended state are different. For example, the extendable portions in the engaged state may engage portions of the chassis at an engaged state distance that is less than the extended state distance, maintaining a lateral bias force at the engagement between the chassis and the extendable portions. In another implementation, the engaged state distance and the extended state distance are substantially the same, such that when the extendable portions are engaged with the chassis, a biased lateral force is substantially not applied by the extendable portions to the chassis (substantially in the sense that manufacturing tolerances may provide too narrow a width in the chassis for the extendable portions to fully extend within the chassis).

The extendable portions may include radially terminal complementary portions that are shaped to complement complementary portions of the chassis. For example, the chassis may include one or more of apertures or recesses that may be complementarily shaped to conformingly receive the radially terminal complementary portions of the extendable portions. In implementations, the radially terminal complementary portions are triangular, and the chassis includes complementarily-shaped recesses. In an implementation, the extendable portions extend through the chassis in the engaged state. In an alternative implementation, the extendable portions remain within the chassis when engaged.

Figure 6:
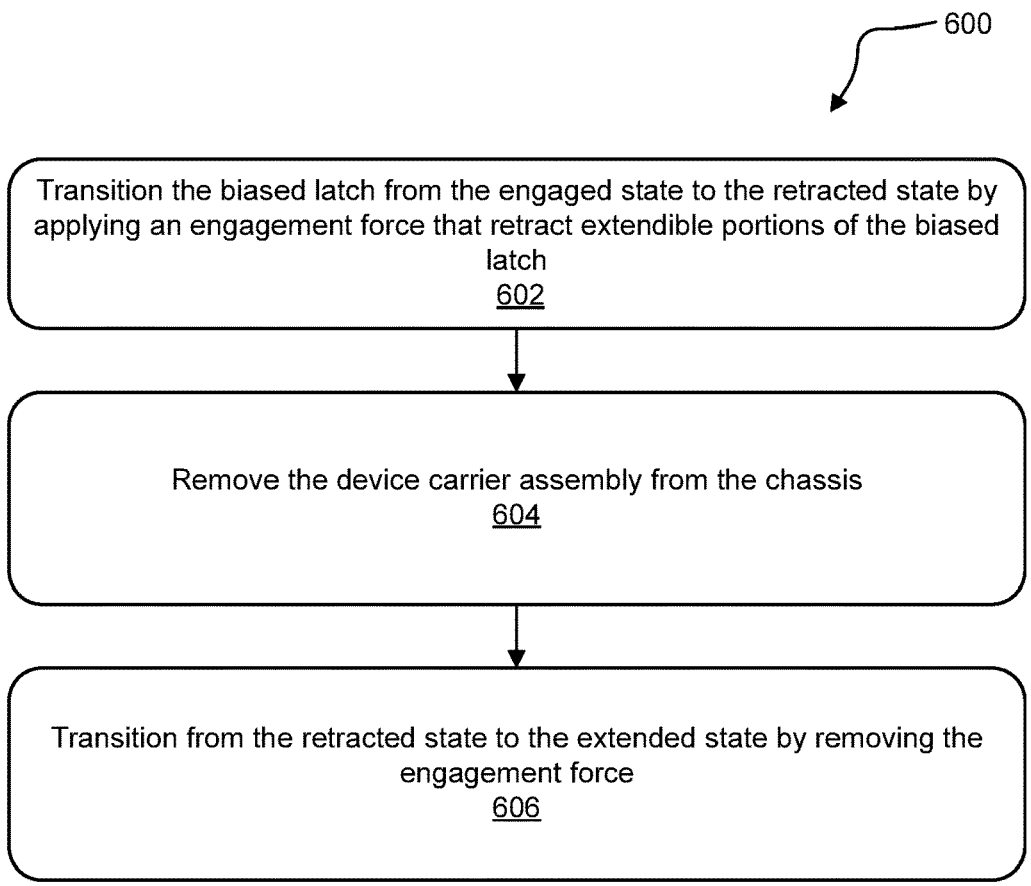
FIG. 6 illustrates example operations for removing a device carrier assembly from a chassis of a computing device.

FIG. 6 illustrates example operations for removing a device carrier assembly from a chassis of a computing device. An applying operation 602 applies an engagement force to the biased latch to retract the extendable portions to transition the biased latch from the engaged state to the retracted state.

A removing operation 604 removes the device carrier assembly from the chassis. The removing operation 604 removes the device carrier assembly (e.g., by engaging one or more of the engagement elements and a first element of the biased latch).

A removing operation 606 removes the application of the engagement force to allow the biased latch to transition from the retracted state to the extended state. The removing operation 606 may remove the engagement force after the extendable elements clear predefined engagement portions within the chassis even while the extendable elements remain within the chassis, or the engagement force may be removed after the engagement elements leave the chassis. The removal of the engagement force may allow the biased latch to transition from the retracted state to the extended state (e.g., after the extendable portions leave the chassis).

In an implementation, an automated (e.g., robotic) device that includes an actuator assembly is adapted to engage the device carrier assembly (e.g., at the engagement elements). The actuator assembly may be operable to perform one or more of the operations 500 and/or one or more of the operations 600 (e.g., by executing by a processor automated actuator protocols stored in a storage media device). The actuator assembly may be operable to manipulate the biased latch by applying an engagement force to engagement elements of the biased latch. The actuator assembly may include actuator engagement portions that complement and/ or are operable to engage the engagement elements (e.g., at complementary portions of the engagement elements) to transition the biased latch between one or more of the engaged state, the retracted state, and the extended state.

The actuator engagement portions may be operable to apply engagement forces to the engagement elements to oppose the bias force of the biased latch and/or to engage one or more of the engagement elements and the first element to move the device carrier assembly in one or more of insertion and removal directions. This configuration may allow the actuator assembly to insert the device carrier assembly into or remove the device carrier assembly from the chassis. The actuator assembly may be operated in conjunction with a sensor to detect indicators of a mechanical indicator and determine by an automated actuator protocol when sufficient force has been applied to transition the biased latch between the states (e.g., in a feedback loop). In implementations, the same or a different sensor can be used by the automated device to determine for how long and/or how far to either insert the device carrier assembly to a predefined position in a chassis and/or remove the device carrier assembly from the chassis (e.g., in a different feedback loop). Implementations are also contemplated in which one or more of a predefined engagement force, an insertion protocol, a removal protocol, a predefined insertion distance, and a predefined removal distance are preprogrammed in the automated actuator protocols, such that the actuator assembly may not use the sensor (e.g., which may then be omitted) or may use the sensor for confirmation. Implementations are contemplated in which the biased latch and/or the carrier assembly are manually operated, and the actuator assembly and/or the sensor are omitted.

Figure 7:
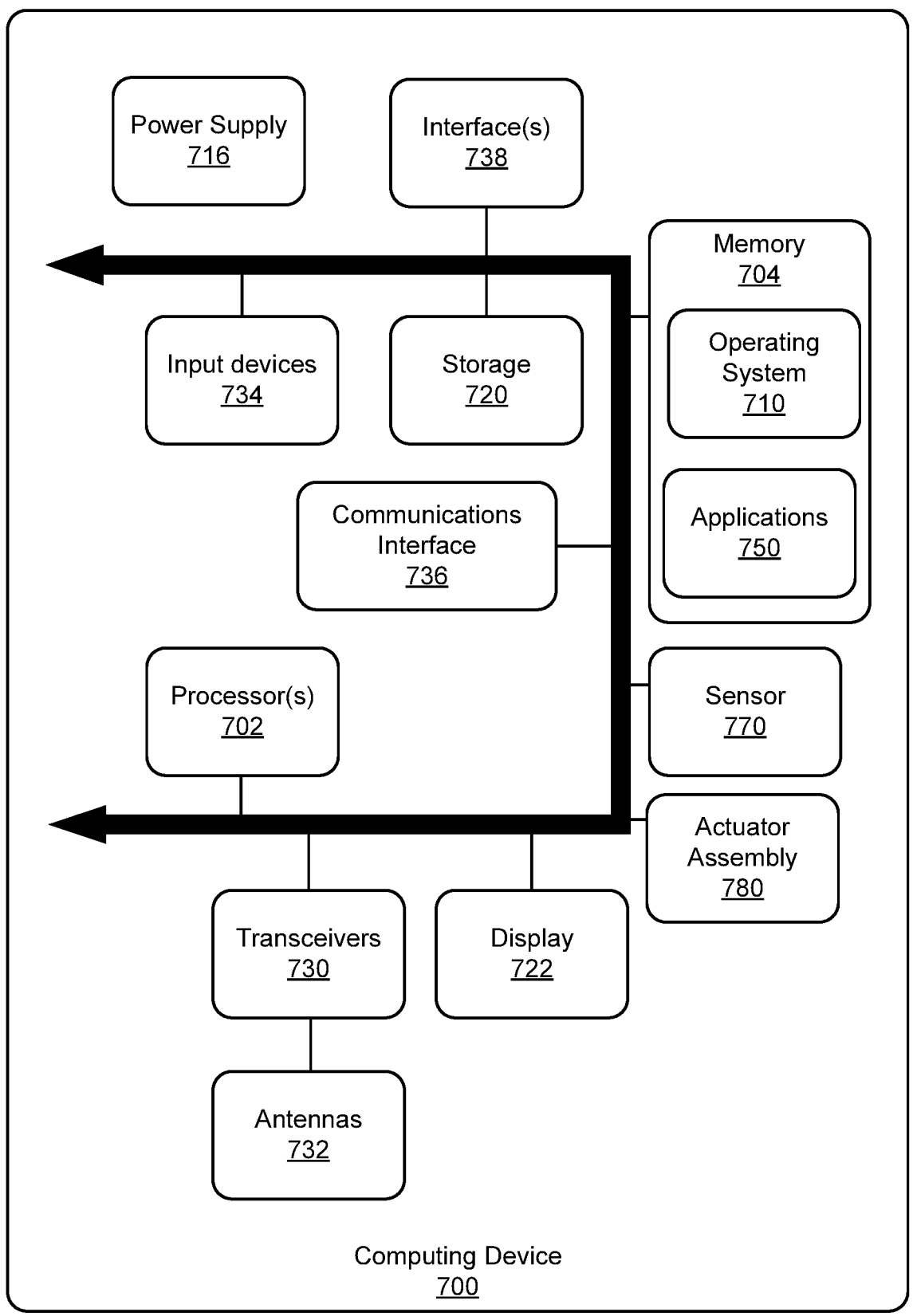
FIG. 7 illustrates an example computing device for implementing the features and operations of the described technology.

FIG. 7 illustrates an example computing device 700 for implementing the features and operations of the described technology. The computing device 700 may embody a remote-control device or a physical controlled device and is an example network-connected and/or network-capable device and may be a client device, such as a laptop, mobile device, desktop, tablet; a server/cloud device; an internet-of-things device; an electronic accessory; or another electronic device. The computing device 700 includes one or more processor(s) 702 and a memory 704. The memory 704 generally includes both volatile memory (e.g., RAM) and nonvolatile memory (e.g., flash memory). An operating system 710 resides in the memory 704 and is executed by the processor(s) 702. The computing device 700 may be an element and/or an implementation of the computing device system 100 or the automated (e.g., robotic) device.

In an example computing device 700, as shown in FIG. 7, one or more modules or segments, such as applications 750 and an automated actuator protocol (e.g., including one or more of an insertion protocol and a removal protocol) are loaded into the operating system 710 on the memory 704 and/or storage 720 and executed by the processor(s) 702. The storage 720 may include one or more tangible storage media devices and may store data representing an indicator (e.g., of a mechanical indicator), a predefined engagement force (e.g., to apply to engagement elements), locally and globally unique identifiers, requests, responses, and other data and be local to the computing device 700 or may be remote and communicatively connected to the computing device 700.

The computing device 700 includes a power supply 716, which is powered by one or more batteries or other power sources and which provides power to other components of the computing device 700. The power supply 716 may also be connected to an external power source that overrides or recharges the built-in batteries or other power sources.

The computing device 700 may include one or more communication transceivers 730, which may be connected to one or more antenna(s) 732 to provide network connectivity (e.g., mobile phone network, Wi-Fi®, Bluetooth®) to one or more other servers and/or client devices (e.g., mobile devices, desktop computers, or laptop computers). The computing device 700 may further include a communications interface 736 (e.g., a network adapter), which is a type of computing device. The computing device 700 may use the communications interface 736 and any other types of computing devices for establishing connections over a wide-area network (WAN) or local-area network (LAN). It should be appreciated that the network connections shown are examples and that other computing devices and means for establishing a communications link between the computing device 700 and other devices may be used.

The computing device 700 may include one or more input devices 734 such that a user may enter commands and information (e.g., a keyboard or mouse). These and other input devices may be coupled to the server by one or more interfaces 738, such as a serial port interface, parallel port, or universal serial bus (USB). The computing device 700 may further include a display 722, such as a touch screen display.

In implementations in which the computing device 700 includes or is an automated (e.g., robotic) device, the computing device 700 may include an actuator assembly 780 adapted to engage a device carrier assembly (e.g., at the engagement elements). The actuator assembly 780 may be operable to perform operations disclosed herein including one or more of the operations 500 and/or one or more of the operations 600 (e.g., by executing by the processor(s) 702 automated actuator protocols stored in the storage 720 and/or the memory 704). The actuator assembly 780 may be operable to manipulate the biased latch by applying an engagement force to engagement elements of the biased latch. The actuator assembly 780 may include actuator engagement portions that complement and/or are operable to engage the engagement elements (e.g., at complementary portions of the engagement elements) to transition the biased latch between one or more of the engaged state, the retracted state, and the extended state.

The actuator engagement portions may be operable to apply engagement forces to the engagement elements to oppose the bias force of the biased latch and/or to engage one or more of the engagement elements and a first portion of the biased latch to move the device carrier assembly in one or more of insertion and removal directions. This configuration may allow the actuator assembly 780 to insert the device carrier assembly into or remove the device carrier assembly from the chassis. The actuator assembly 780 may be operated in conjunction with a sensor 770 to use the mechanical indicator to detect indicators of a mechanical indicator and determine by an automated actuator protocol when sufficient force has been applied to transition the biased latch between the states (e.g., in a feedback loop). In implementations, the same or a different sensor 770 to determine for how long or how far to either insert the device carrier assembly to a predefined position in a chassis and/or remove the device carrier assembly from the chassis (e.g., in a different feedback loop). Implementations are also contemplated in which one or more of a predefined engagement force, an insertion protocol, a removal protocol, a predefined insertion distance, and a predefined removal distance are preprogrammed in the automated actuator protocols, such that the actuator assembly 780 may not use the sensor 770 (e.g., which may then be omitted) or may use the sensor 770 for confirmation. Implementations are contemplated in which the biased latch and/or the carrier assembly are manually operated, and the actuator assembly 780 and/or the sensor 770 are omitted.

The computing device 700 may include a variety of tangible processor-readable storage media and intangible processor-readable communication signals. Tangible processor-readable storage can be embodied by any available media that can be accessed by the computing device 700 and includes both volatile and nonvolatile storage media, removable and non-removable storage media. Tangible processor-readable storage media excludes communications signals (e.g., signals per se) and includes volatile and nonvolatile, removable and non-removable storage media implemented in any method or technology for storage of information such as processor-readable instructions, data structures, program modules, or other data. Tangible processor-readable storage media includes, but is not limited to, RAM, ROM, EEPROM, flash memory or other memory technology, CDROM, digital versatile disks (DVD) or other optical disk storage, magnetic cassettes, magnetic tape, magnetic disk storage, or other magnetic storage devices, or any other tangible medium which can be used to store the desired information and which can be accessed by the computing device 700. In contrast to tangible processor-readable storage media, intangible processor-readable communication signals may embody processor-readable instructions, data structures, program modules, or other data resident in a modulated data signal, such as a carrier wave or other signal transport mechanism. The term "modulated data signal" means a signal that has one or more of its characteristics set or changed in such a manner as to encode information in the signal. By way of example, and not limitation, intangible communication signals include signals traveling through wired media such as a wired network or direct-wired connection, and wireless media such as acoustic, RF, infrared, and other wireless media.

Various software components described herein are executable by one or more processors, which may include logic machines configured to execute hardware or firmware instructions. For example, the processors may be configured to execute instructions that are part of one or more applications, services, programs, routines, libraries, objects, components, data structures, or other logical constructs. Such instructions may be implemented to perform a task, implement a data type, transform the state of one or more components, achieve a technical effect, or otherwise arrive at a desired result.

Aspects of processors and storage may be integrated together into one or more hardware logic components. Such hardware-logic components may include field-programmable gate arrays (FPGAs), program- and application-specific integrated circuits (PASIC/ASICs), program-specific and application-specific standard products (PSSP/ASSPs), system-on-a-chip (SOC), and complex programmable logic devices (CPLDs), for example.

The terms "module," "program," and "engine" may be used to describe an aspect of a remote-control device and/or a physically controlled device implemented to perform a particular function. It will be understood that different modules, programs, and/or engines may be instantiated from the same application, service, code block, object, library, routine, API, function, etc. Likewise, the same module, program, and/or engine may be instantiated by different applications, services, code blocks, objects, routines, APIs, functions, etc. The terms "module," "program," and "engine" may encompass individual or groups of executable files, data files, libraries, drivers, scripts, database records, etc.

It will be appreciated that a "service," as used herein, is an application program executable across one or multiple user sessions. A service may be available to one or more system components, programs, and/or other services. In some implementations, a service may run on one or more server computing devices.

The logical operations making up implementations of the technology described herein may be referred to variously as operations, steps, objects, or modules. Furthermore, it should be understood that logical operations may be performed in any order, adding or omitting operations as desired, regardless of whether operations are labeled or identified as optional, unless explicitly claimed otherwise or a specific order is inherently necessitated by the claim language.

An example storage device carrier assembly adapted to removably mate with a chassis is provided. The storage device carrier assembly includes a storage device carrier adapted to be coupled to a storage device and a biased latch attached to the storage device carrier and adapted to transition between an engaged state and a retracted state to facilitate removal of the storage device carrier from the chassis, the biased latch including extendable portions adapted to engage the chassis in the engaged state.

Another example storage device carrier assembly of any preceding assembly is provided, wherein the biased latch includes one or more of a tension spring and a compression spring that is biased towards laterally extending the extendable portions.

Another example storage device carrier assembly of any preceding assembly is provided, wherein the extendable portions are adapted to engage recesses in the chassis at predetermined positions.

Another example storage device carrier assembly of any preceding assembly is provided, wherein the chassis includes an interface to a computing system and wherein the storage device carrier assembly is adapted to establish communication with the interface when the biased latch is in the engaged state.

Another example storage device carrier assembly of any preceding assembly is provided, wherein the extendable portions are adapted to engage with the chassis by extending into a recess of the chassis in the engaged state and wherein the extendable portions are extended less than in the engaged state when in the retracted state.

Another example storage device carrier assembly of any preceding assembly is provided, wherein the biased latch further comprises a mechanical indicator that is adapted to be altered in state by transitioning the biased latch between the engaged state and the retracted state.

Another example storage device carrier assembly of any preceding assembly is provided, wherein the mechanical indicator is externally visible on the storage device carrier assembly through a transparent portion of the biased latch, the transitioning of the biased latch from the retracted state to the engaged state sliding the transparent portion relative to an underlying base component.

An example method is provided. The method includes applying a force to extendable portions of a biased latch to transition the biased latch between an extended state and a retracted state, the biased latch being included within a device carrier assembly and attached to a device carrier that is configured to receive a computing element, while applying the force, inserting a portion of the device carrier assembly into a chassis until the portion of the device carrier assembly reaches a predefined position in the chassis, and removing the applied force, responsive to the device carrier assembly reaching the predefined position, the removal of the force transitioning the biased latch from a retracted state to an engaged state, wherein extendable portions of the biased latch in the engaged state engage a portion of the chassis and extend further than in the retracted state.

Another example method of any preceding method is provided, wherein the biased latch includes one or more of a tension spring and a compression spring that is biased towards laterally extending the extendable portions.

Another example method of any preceding method is provided, wherein removal of the applied force engages the extendable portions in recesses in the chassis at predetermined positions.

Another example method of any preceding method is provided, wherein the chassis includes an interface to a computing system and wherein the device carrier assembly is adapted to establish communication with the interface when the biased latch is in the engaged state.

Another example method of any preceding method is provided, wherein the biased latched is adapted to transition between the engaged state and the retracted state without rotating a component of the biased latch relative to the device carrier assembly.

Another example method of any preceding method is provided, wherein the biased latch includes a mechanical indicator adapted to be altered in state by transitioning the biased latch between the engaged state and the retracted state.

Another example method of any preceding method is provided, wherein the mechanical indicator is externally visible on the device carrier assembly through a transparent portion of the biased latch, the transitioning of the biased latch from the retracted state to the extended state including sliding the transparent portion relative to an underlying base component.

An example automated hardware manipulation system is provided. The automated hardware manipulation system includes a device carrier assembly adapted to removably mate with a chassis, the device carrier assembly including a device carrier adapted to receive a computing element and a biased latch attached to the device carrier and adapted to transition between an engaged state and a retracted state, the retracted state facilitating removal of the device carrier from the chassis, the biased latch including extendable portions adapted to engage the chassis in the engaged state.

Another example automated hardware manipulation system of any preceding system is provided, further including an actuator assembly operable to apply an engagement force to the biased latch to transition the biased latch between the engaged state and the retracted state or to transition the biased latch between the retracted state and an extended state in which the extendable portions extend farther than in the engaged state and the retracted state.

Another example automated hardware manipulation system of any preceding system is provided, wherein the actuator assembly is further operable to insert the device carrier assembly into the chassis while maintaining the engagement force.

Another example automated hardware manipulation system of any preceding system is provided, wherein the biased latch includes a mechanical indicator that is adapted to be altered in state by transitioning the biased latch between the engaged state and the retracted state.

Another example automated hardware manipulation system of any preceding system is provided, wherein the mechanical indicator is externally visible on the device carrier assembly through a transparent portion of the biased latch, the transitioning of the biased latch from the retracted state to the extended state sliding the transparent portion relative to an underlying base component, and wherein the actuator assembly is operable to detect a state of the mechanical indicator and alter a force applied to the biased latch responsive to the detection.

Another example automated hardware manipulation system of any preceding system is provided, wherein the extendable portions are adapted to engage recesses in the chassis at predetermined positions when the biased latch is in the engaged state and within the chassis.

An example system is provided. The system includes means for applying a force to extendable portions of a biased latch to transition the biased latch between an extended state and a retracted state, the biased latch being included within a device carrier assembly and attached to a device carrier that is configured to receive a computing element, means for inserting, during the application of the force, a portion of the device carrier assembly into a chassis until the portion of the device carrier assembly reaches a predefined position in the chassis, and means for removing the applied force, responsive to the device carrier assembly reaching the predefined position, the removal of the force transitioning the biased latch from a retracted state to an engaged state, wherein extendable portions of the biased latch in the engaged state engage a portion of the chassis and extend further than in the retracted state.

Another example system of any preceding system is provided, wherein the biased latch includes one or more of a tension spring and a compression spring that is biased towards laterally extending the extendable portions.

Another example system of any preceding system is provided, wherein removal of the applied force engages the extendable portions in recesses in the chassis at predetermined positions.

Another example system of any preceding system is provided, wherein the chassis includes an interface to a computing system and wherein the device carrier assembly is adapted to establish communication with the interface when the biased latch is in the engaged state.

Another example system of any preceding system is provided, wherein the biased latched is adapted to transition between the engaged state and the retracted state without rotating a component of the biased latch relative to the device carrier assembly.

Another example system of any preceding system is provided, wherein the biased latch includes a mechanical indicator adapted to be altered in state by transitioning the biased latch between the engaged state and the retracted state.

Another example system of any preceding system is provided, wherein the mechanical indicator is externally visible on the device carrier assembly through a transparent portion of the biased latch, the means for transitioning of the biased latch from the retracted state to the extended state including means for sliding the transparent portion relative to an underlying base component.

While this specification contains many specific implementation details, these should not be construed as limitations on the scope of any technologies or of what may be claimed, but rather as descriptions of features specific to particular implementations of the particular described technology. Certain features that are described in this specification in the context of separate implementations can also be implemented in combination in a single implementation. Conversely, various features that are described in the context of a single implementation can also be implemented in multiple implementations separately or in any suitable sub-combination. Moreover, although features may be described above as acting in certain combinations and even initially claimed as such, one or more features from a claimed combination can in some cases be excised from the combination, and the claimed combination may be directed to a sub-combination or variation of a sub-combination.

Similarly, while operations are depicted in the drawings in a particular order, this should not be understood as requiring that such operations be performed in the particular order shown or in sequential order, or that all illustrated operations be performed, to achieve desirable results. In some cases, the actions recited in the claims can be performed in a different order and still achieve desirable results. In certain circumstances, multitasking and parallel processing may be advantageous. Moreover, the separation of various system components in the implementations described above should not be understood as requiring such separation in all implementations, and it should be understood that the described program components and systems can generally be integrated together in a single software product or packaged into multiple software products. Thus, particular implementations of the subject matter have been described. Other implementations are within the scope of the following claims. Nevertheless, it will be understood that various modifications can be made without departing from the spirit and scope of the recited claims.

As used herein, terms such as "substantially," "about," "approximately," or other terms of relative degree are interpreted as a person skilled in the art would interpret the terms and/or amount to a magnitude of variability of one or more of 1%, 2%, 3%, 4%, 5%, 6%, 7%, 8%, 9%, 10%, 11%, 12%, 13%, 14%, or 15% of a metric relative to the quantitative or qualitative feature described. For example, a term of relative degree applied to orthogonality suggests an angle may have a magnitude of variability relative to a right angle. When values are presented herein for particular features and/or a magnitude of variability, ranges above, ranges below, and ranges between the values are contemplated.

What is claimed is:

1. A storage device carrier assembly adapted to removably mate with a chassis, including:
 a storage device carrier adapted to be coupled to a storage device; and
 a biased latch attached to the storage device carrier and adapted to transition between an engaged state and a retracted state to facilitate removal of the storage device carrier from the chassis, the biased latch including:
  extendable portions, a first of the extendable portions including a slideable window, the extendable portions adapted to engage the chassis in the engaged state; and
  an underlying element that includes indicators and that underlies the first of the extendable portions, the transition between the engaged state and the retracted state causing the slideable window of the first of the extendable portions to slide relative to the underlying element to expose a first of the indicators through the slideable window.

2. The storage device carrier assembly of claim 1, wherein the biased latch includes a tension spring or a compression spring that is biased towards laterally extending the extendable portions.

3. The storage device carrier assembly of claim 1, wherein the extendable portions are adapted to engage recesses in the chassis at predetermined positions.

4. The storage device carrier assembly of claim 1, wherein the chassis includes an interface to a computing system and wherein the storage device carrier assembly is adapted to establish communication with the interface when the biased latch is in the engaged state.

5. The storage device carrier assembly of claim 1, wherein the extendable portions are adapted to engage with the chassis by each extending into a recess of the chassis in the engaged state and wherein the extendable portions are extended less than in the engaged state when in the retracted state.

6. The storage device carrier assembly of claim 1, wherein the transitioning the biased latch between the engaged state and the retracted state further includes sliding the slideable window from a second position exposing a second of the indicators through the slideable window to a first position exposing the first of the indicators through the slideable window.

7. The storage device carrier assembly of claim 6, wherein the first of the indicators is externally visible on the storage device carrier assembly through the slideable window.

8. The storage device carrier assembly of claim 1, wherein the transition between the engaged state and the retracted state includes sliding the slideable window from a second position at which the slideable window exposes a second of the indicators adapted to indicate that the storage device carrier assembly is in the engaged state to a first position at which the slideable window exposes the first of the indicators exclusively of the second of the indicators, the first of the indicators adapted to indicate that the storage device carrier assembly is in the retracted state.

9. A method, comprising:
  transitioning a biased latch between an extended state and a retracted state by applying a force to extendable portions of the biased latch, the force causing a first of the extendable portions to slide relative to an underlying portion and to expose one of a plurality of indicators on the underlying portion through a slideable window of the first of the extendable portions, the biased latch being included within a device carrier assembly and attached to a device carrier that is configured to receive a computing element;
  while applying the force, inserting the device carrier assembly into a chassis until the device carrier assembly reaches a predefined position in the chassis; and
  removing the applied force, responsive to the device carrier assembly reaching the predefined position, the removal of the force transitioning the biased latch from the retracted state to an engaged state, wherein extendable portions of the biased latch in the engaged state engage recesses in walls of the chassis and extend further than in the retracted state.

10. The method of claim 9, wherein the biased latch includes a tension spring or a compression spring that is biased towards laterally extending the extendable portions.

11. The method of claim 9, wherein the chassis includes an interface to a computing system and wherein the device carrier assembly is adapted to establish communication with the interface when the biased latch is in the engaged state.

12. The method of claim 9, wherein the biased latch is adapted to transition between the engaged state and the retracted state without rotating any component of the biased latch relative to the device carrier assembly.

13. The method of claim 9, wherein the transitioning the biased latch the retracted state to the engaged state includes sliding the slideable window from a first position at which the slideable window exposes a first indicator of the plurality indicators adapted to indicate that the device carrier assembly is in the retracted state, to a second position at which the slideable window exposes a second indicator of the plurality indicators exclusively of the first indicator, the second indicator adapted to indicate that the device carrier assembly is in the engaged state.

14. The method of claim 9, wherein the one of the plurality of indicators is externally visible on the device carrier assembly through the slideable window.

15. An automated hardware manipulation system, comprising:
  a device carrier assembly adapted to removably mate with a chassis, including:
    a device carrier adapted to receive a computing element; and
    a biased latch attached to the device carrier and adapted to transition between an engaged state and a retracted state, the retracted state facilitating removal of the device carrier from the chassis, the biased latch including extendable portions adapted to engage the chassis in the engaged state, the extendable portions including a slideable window adapted to expose one of a plurality of indicators; and
  an actuator assembly operable to apply an engagement force to the biased latch to transition the biased latch between the engaged state and the retracted state based on which one of the plurality of indicators is exposed.

16. The automated hardware manipulation system of claim 15,
  wherein the actuator assembly is further operable to transition the biased latch between the retracted state and an extended state in which the extendable portions extend farther than in the engaged state and the retracted state.

17. The automated hardware manipulation system of claim 16, wherein the actuator assembly is further operable to insert the device carrier assembly into the chassis while maintaining the engagement force.

18. The automated hardware manipulation system of claim 15, wherein the transition of the biased latch between the engaged state and the retracted state includes sliding the slideable window from a first position at which the slideable window exposes a first indicator of the plurality of indicators to a second position at which the slideable window exposes a second of the plurality of indicators.

19. The automated hardware manipulation system of claim 15, the biased latch further comprising:
- an underlying base component including the plurality of indicators and underlying a first of the extendable portions, wherein the exposed one of the plurality of indicators is externally visible on the device carrier assembly through the slideable window, the applied force sliding the slideable window relative to the underlying base component, and wherein the actuator assembly is operable to:
- detect the exposed one of the plurality of indicators; and
- alter the engagement force applied to the biased latch responsive to the detection.

20. The automated hardware manipulation system of claim 16, wherein the extendable portions are adapted to engage recesses in the chassis at predetermined positions when the biased latch is in the engaged state and within the chassis.

* * * * *